US009034686B2

(12) United States Patent
Peng et al.

(10) Patent No.: US 9,034,686 B2
(45) Date of Patent: May 19, 2015

(54) MANUFACTURING METHODS FOR SEMICONDUCTOR DEVICES

(75) Inventors: Hongying Peng, Clifton Park, NY (US); Bastiaan Arie Korevaar, Schenectady, NY (US); Jinbo Cao, Rexford, NY (US); Stephen Lorenco Araujo, Burnt Hills, NY (US); Scott Daniel Feldman-Peabody, Golden, CO (US); Robert Dwayne Gossman, Aurora, CO (US)

(73) Assignee: First Solar, Inc., Tempe, AZ (US)

( * ) Notice: Subject to any disclaimer, the term of this patent is extended or adjusted under 35 U.S.C. 154(b) by 67 days.

(21) Appl. No.: 13/538,352

(22) Filed: Jun. 29, 2012

(65) Prior Publication Data

US 2014/0004655 A1 Jan. 2, 2014

(51) Int. Cl.
*H01L 31/18* (2006.01)
*H01L 31/073* (2012.01)

(52) U.S. Cl.
CPC ........ *H01L 31/1828* (2013.01); *H01L 31/1872* (2013.01); *H01L 31/1884* (2013.01); *H01L 31/18* (2013.01); *H01L 31/073* (2013.01)

(58) Field of Classification Search
CPC ............ H01L 31/1828; H01L 31/1872; H01L 31/1884
USPC .................. 438/57, 84, 96, 97; 257/E31.008, 257/E31.015; 136/260
See application file for complete search history.

(56) References Cited

U.S. PATENT DOCUMENTS

| | | | | |
|---|---|---|---|---|
| 6,137,048 A | * | 10/2000 | Wu et al. | 136/260 |
| 6,423,565 B1 | * | 7/2002 | Barth et al. | 438/57 |
| 6,444,043 B1 | * | 9/2002 | Gegenwart et al. | 118/726 |
| 7,943,415 B1 | * | 5/2011 | Gossman et al. | 438/93 |
| 8,252,618 B2 | * | 8/2012 | O'Keefe | 438/84 |
| 2009/0194165 A1 | * | 8/2009 | Murphy et al. | 136/260 |
| 2010/0051090 A1 | * | 3/2010 | Lee | 136/246 |
| 2010/0186815 A1 | * | 7/2010 | Yang et al. | 136/256 |
| 2010/0221901 A1 | * | 9/2010 | Cai et al. | 438/492 |
| 2010/0243437 A1 | * | 9/2010 | Gessert et al. | 204/298.09 |
| 2010/0319775 A1 | * | 12/2010 | Mills et al. | 136/260 |
| 2011/0017298 A1 | * | 1/2011 | Lee | 136/261 |
| 2011/0143487 A1 | * | 6/2011 | Lee | 438/74 |
| 2012/0000519 A1 | * | 1/2012 | Frey | 136/256 |
| 2012/0037201 A1 | | 2/2012 | Buller et al. | |

(Continued)

OTHER PUBLICATIONS

X. Wu et al., "CdS/CdTe Thin-Film Solar Cell with a Zinc Stannate Buffer Layer," National Renewal Energy Laboratory, National Center for Photovoltaics Program Review Meeting, Sep. 8-11, 1998, pp. 1-5.

(Continued)

*Primary Examiner* — Joseph C Nicely
(74) *Attorney, Agent, or Firm* — MacMillan, Sobanski & Todd, LLC

(57) ABSTRACT

Embodiments of the present invention include a method. The method includes heating a layer stack. The layer stack includes a first layer comprising cadmium and tin, a metal layer disposed over the first layer, and a window layer disposed over the metal layer. Heating the stack includes transforming at least a portion of the first layer from an amorphous phase to a crystalline phase. Heating may be performed using any of various configurations, such as, for example, heating an individual stack, or using a face-to-face configuration of multiple stacks. The stack may be used for fabricating a photovoltaic device.

22 Claims, 2 Drawing Sheets

(56) References Cited

U.S. PATENT DOCUMENTS

| | | | |
|---|---|---|---|
| 2012/0056290 A1* | 3/2012 | Klein et al. | 257/432 |
| 2012/0104440 A1* | 5/2012 | Peng et al. | 257/98 |
| 2012/0138980 A1* | 6/2012 | Kuo et al. | 257/94 |
| 2012/0238053 A1* | 9/2012 | Girt et al. | 438/85 |
| 2013/0109124 A1* | 5/2013 | Peng et al. | 438/58 |
| 2013/0157405 A1* | 6/2013 | Cao et al. | 438/95 |
| 2013/0327398 A1* | 12/2013 | Dhere et al. | 136/256 |
| 2014/0069502 A1* | 3/2014 | Girt | 136/261 |

OTHER PUBLICATIONS

X,. Wu et al., "A Novel Manufacturing Process for Fabricating Cds/Cdte Polycrystalline Thin-Film Solar Cells," 16th European Photovoltaic Solar Energy Conference and Exhibition, May 1-5, 2000, pp. 1-4.

D.S. Albin et al., "Degradation and Capacitance-Voltage Hysteresis in CdTe Devices," Proceedings of SPIE, vol. 7412, Aug. 2-6, 2009, pp. 1-12.

S. R. Gayam, High resistivity zinc stannate as a buffer layer in CdS/CdTe solar cells, Scholar Commons, University of South Florida, Mar. 23, 2005, pp. 1-79.

D. Albin et. al., "Effect of Hysteresis on Measurements of Thin-Film Cell Performance," SPIE Conference, National Renewable Energy Laboratory, Aug. 3-5, 2010, pp. 1-9.

\* cited by examiner

MANUFACTURING METHODS FOR SEMICONDUCTOR DEVICES

BACKGROUND

The invention relates generally to methods for annealing semiconductor layers and, more particularly, to methods for annealing semiconductor layers for the manufacture of photovoltaic (PV) devices.

PV (or solar) cells are used for converting solar energy into electrical energy. Thin film PV devices may include a number of semiconductor layers disposed on a transparent support, where one semiconductor layer serves as a window layer, and a second semiconductor layer serves as an absorber layer. Solar radiation travels through the window layer to the absorber layer, where the optical energy is converted to usable electrical energy. Additional layers are often employed to enhance the conversion efficiency of the PV device.

There are a variety of candidate material systems for PV cells, each of which has certain advantages and disadvantages. Cadmium telluride/cadmium sulfide (CdTe/CdS) hetero-junction-based photovoltaic cells are one such example of thin film solar cells.

Thin film solar cell manufacturing typically requires a significant number of processing steps to form multiple layers on a substrate. Because of the large number of processing steps, layers, and interfaces, thin film solar cells can be expensive and time consuming to manufacture. Researchers are continually striving to improve the efficiency and reduce the production costs of the thin film PV cells.

A typical polycrystalline thin film PV cell has a very thin (typically less than 0.2 micron) layer called the "window" layer. The window layer's role is to form a heterojunction in combination with an absorber layer. The window layer desirably is thin enough and has a wide enough bandgap (2.4 eV or more) to transmit most available light through to the absorber layer. For copper indium gallium selenide (CIGS) and CdTe type solar cells, the most common material for the window layer is cadmium sulfide (CdS), which is a direct bandgap semiconductor. Various methods may be used to deposit CdS thin films, for example chemical bath deposition, sol-gel, electrochemical deposition, thermal evaporation, sputtering, sublimation, and spraying.

Typically, a thin layer of transparent conductive oxide (TCO) is deposited between the substrate and the window layer (for example, CdS) to function as a front contact current collector. Cadmium tin oxide (CTO) is one example of a material useful as a TCO in thin film PV cells.

CIGS and CdTe photovoltaic devices can suffer reduced performance due in part to the loss of photons at the TCO layer and/or window layer. Thus, it would be desirable to increase the light transmission of these layers.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

BRIEF DESCRIPTION OF THE INVENTION

Figure 1:
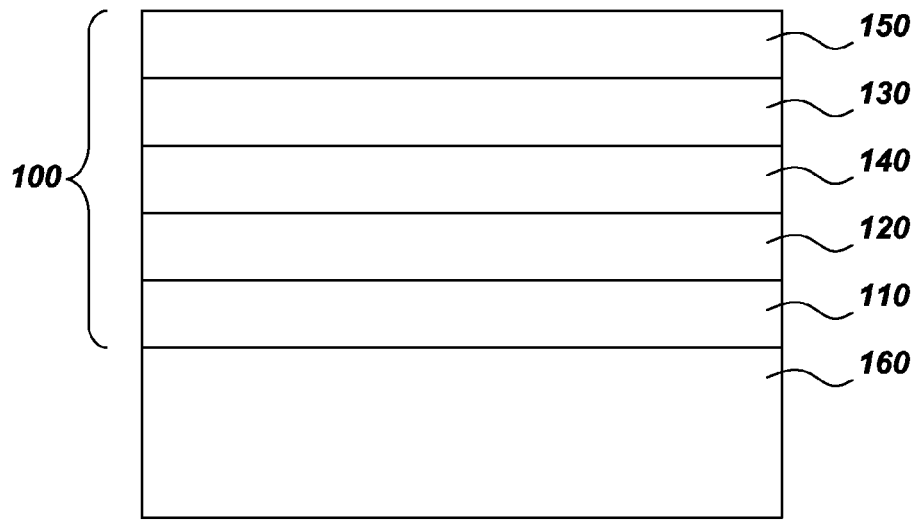
FIG. 1 is a schematic cross-sectional representation of a layer stack in accordance with one embodiment of the present invention.

Embodiments of the present invention are provided to meet these and other needs. One embodiment is a method. The method includes heating a layer stack that includes a first layer comprising cadmium and tin, a metal layer disposed over the first layer, and a window layer disposed over the metal layer. The heating step comprises transforming at least a portion of the first layer from an amorphous phase to a crystalline phase.

Another embodiment is a method. The method comprises heating an assembly. The assembly comprises a first panel comprising a first layer stack disposed on a first support, and a second panel comprising a second layer stack disposed on a second support. The second panel faces the first panel, and each of the first layer stack and the second layer stack comprises a first layer comprising cadmium and tin, a metal layer disposed over the first layer, and a window layer disposed over the metal layer. The heating step comprises transforming at least a portion of the first layer of either layer stack, or of both layer stacks, from an amorphous phase to a crystalline phase.

DETAILED DESCRIPTION

As discussed in detail below, some of the embodiments of the present invention include methods for manufacturing semiconductor devices, such as photovoltaic (PV) devices.

As used herein, the terms "first," "second," and the like, do not denote any order, quantity, or importance, but are used to distinguish one element from another. The terms "a" and "an" herein do not denote a limitation of quantity, but denote the presence of at least one of the referenced items. Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value. In particular, the modifier "about" used in connection with a quantity is inclusive of the stated value, and has the meaning dictated by context, (e.g., includes the degree of error associated with measurement of the particular quantity).

In addition, the term "combination" is inclusive of blends, mixtures, alloys, reaction products, and the like. Series of items joined herein by the conjunctions "and" or "or" are not intended to provide mutually exclusive options unless explicitly stated.

Moreover, in this specification, the suffix "(s)" is usually intended to include both the singular and the plural of the term that it modifies, thereby including one or more of that term. Reference throughout the specification to "one embodiment," or "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

Further, the terms "transparent region", "transparent layer" and "transparent electrode" as used herein, refer to a region, a layer, or an article that allows an average transmission of at least 80% of incident electromagnetic radiation having a wavelength in a range from about 300 nm to about 850 nm. As used herein, the terms "disposed on" and "disposed over" refers to layers disposed directly in contact with each other or indirectly by having intervening layers there between.

A transparent conductive oxide (TCO) layer made of cadmium tin oxide (CTO) in a thin film PV cell is often deposited as an amorphous layer using, for example, a sputtering technique. To obtain practical levels of transparency and electrical conductivity, the amorphous layer is generally heat treated to crystallize the CTO. Moreover, a window layer, such as a window layer made of cadmium sulfide (CdS), also may be heat treated after deposition. Without being bound by a particular theory, it is believed that heat treating the cadmium sulfide layer improves its optical transparency and enhances the quality of the junction formed between the CdS layer and the absorber layer, resulting in a device with higher overall operating efficiency.

Some processes described in the art include deposition of the CTO layer, followed by deposition of the window layer and/or absorber layer using an elevated temperature deposition process to simultaneously crystallize the amorphous CTO while deposition of the window layer or absorber layer occurs. However, such processes do not achieve the benefits of heat treatment of the window layer unless a subsequent heat treatment step is employed.

In contrast to these conventional processes, certain embodiments described herein include heating a stack of layers, including layers that ultimately may serve as the TCO and the window layers, to simultaneously process both layers and thereby produce the benefits described above in one step.

Referring to FIG. 1, one embodiment of the present invention is a method that includes the step of heating a layer stack 100. Stack 100 comprises a plurality of layers, including a first layer 110 comprising cadmium and tin. In certain embodiments, first layer 110 further includes oxygen. At least a portion of first layer 110 is transformed during the heating step from an amorphous phase to a crystalline phase. In particular embodiments, the crystalline phase thus formed includes a spinel phase. As used herein, the term "spinel" is intended to include all types of spinel structures, including so-called "normal" spinel, "reverse" spinel, and "intermediate" spinel. The spinel phase in some embodiments comprises cadmium, tin, and oxygen, such as, for example, a cadmium tin oxide spinel. In some embodiments, first layer 110 has a thickness in the range from about 100 nanometers to about 400 nanometers. In some embodiments, layer 110 serves the function of a TCO as described above.

Stack 100 further comprises a metal layer 120. In the embodiment shown, metal layer 120 is disposed over the first layer 110, though in some embodiments, first layer 110 is disposed over metal layer 120. Metal layer 120 includes one or more metallic materials that have a higher affinity for oxygen than cadmium tin oxide and form oxides that have optical and electrical properties such that their presence in a resultant device does not substantially adversely affect device performance. Examples of such metals include, but are not limited to, tin, aluminum, zinc, tantalum, titanium, zirconium, vanadium, indium, nickel, and magnesium. As will be discussed further, below, the presence of the metal layer provides for remarkably desirable properties in heat treated CTO layers, particularly with respect to CTO electrical properties. In some embodiments, the metal layer is up to about 30 nanometers thick, and in particular embodiments has a thickness in the range from about 1 nanometer to about 25 nanometers, and in certain embodiments has a thickness in the range from about 10 nanometers to about 20 nanometers.

Stack 100 further comprises a window layer 130 disposed over metal layer 120, for example, disposed as shown in FIG. 1 with no intervening material between layers 120 and 130, or with first layer 110 intervening (a configuration not shown). In some embodiments, window layer 130 includes cadmium, such as, for instance, a layer including cadmium and sulfur. In some embodiments, the window layer 130 includes cadmium sulfide, oxygenated cadmium sulfide, or combinations thereof. In some embodiments, the window layer 130 includes oxygenated cadmium sulfide having an oxygen content in a range from about 1 weight percent to about 25 weight percent. In particular embodiments, the window layer 130 includes oxygenated cadmium sulfide having an oxygen content in a range from about 1 weight percent to about 15 weight percent. In particular embodiments, the window layer 130 includes oxygenated cadmium sulfide having an oxygen content in a range from about 1 weight percent to about 10 weight percent. Window layer 130 typically, though not necessarily, has a thickness below 200 nm, in some embodiments in a range from about 10 nanometers to about 200 nanometers, and in more particular embodiments from about 20 nanometers to about 100 nanometers.

In certain embodiments, stack 100 further comprises a buffer layer 140. Buffer layer 140 is generally electrically resistive relative to other materials in stack 100, is interposed (directly, as shown, or with intervening material) between metal layer 120 and window layer 130, and is sufficiently transparent to transmit a desirable quantity of incident light to window layer 130. Example materials for buffer layer 140 include zinc tin oxide, tin oxide, zinc oxide, zinc stannate, gallium oxide, aluminum oxide, silicon oxide, titanium oxide, and combinations thereof. In certain embodiments, buffer layer 140 has a thickness in the range from about 10 nanometers to about 400 nanometers.

In certain embodiments, stack 100 further comprises an absorber layer 150 disposed over window layer 130. Suitable materials for use in absorber layer 150 include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium $(Cu(In,Ga,Al)(S,Se)_2)$, copper zinc tin sulfide (CZTS), or combinations thereof. The above-mentioned materials may be used alone or in combination. Further, these materials may be present in more than one layer, each layer having a different type of material or having combinations of the materials in separate layers. In certain embodiments, absorber layer 150 includes cadmium telluride (CdTe). The thickness range for the layer 150 can vary from about 0.5 micrometers to about 10 micrometers, and often is from about 1.5 micrometers to 4 micrometers thick.

The various materials described above may be produced using any one or more deposition techniques known in the art. Examples include sputtering methods, such as magnetron sputtering; chemical bath deposition; chemical vapor deposition; and other deposition techniques based on evaporation or sublimation and condensation. Particular examples of useful deposition techniques include close-space sublimation (CSS), vapor transport deposition (VTD), ion-assisted physical vapor deposition (IAPVD), atmospheric plasma chemical vapor deposition (APCVD) radio frequency or pulsed magnetron sputtering (RFS or PMS), plasma enhanced chemical vapor deposition (PECVD), and electrochemical deposition (ECD).

Stack 100 in some embodiments is disposed on a support 160. In some embodiments, support 160 is transparent over the range of wavelengths for which transmission is desired. For particular configurations, the support 160 may be transparent to visible light having a wavelength in a range of about 350-1000 nm. The material for the support 160 may be selected such that the thermal expansion coefficient of the support 160 is close to the thermal expansion coefficient of the adjacent layer (for example, the first layer 110) to prevent cracking or buckling of the adjacent layer during heat treatments. For certain configurations, the support 160 may comprise a glass. In some embodiments, support 160 comprises a material capable of withstanding heat treatment temperatures greater than about 550° C., such as, for example silica and borosilicate glass. Additional layers (not shown) may be disposed on support 160 between support 160 and first layer 110, and these additional layers typically comprise a so-called "barrier layer," often employing materials such as, but not limited to, silicon oxide and silicon nitride. In the so-called "superstrate configuration" illustrated in FIG. 1, support 160 is typically transparent and disposed proximate to first layer 110. In other configurations, such as the so-called "substrate configuration" (not shown), the support may comprise an opaque material, such as a metal or a polymer, disposed proximate to the absorber layer.

The heating step is performed at a combination of time and temperature such that at least a portion of first layer 110 is transformed during the heating step from an amorphous phase to a crystalline phase. In some embodiments, first layer 110 is heated to a temperature in the range from about 500° C. to about 700° C., and in certain embodiments the range is from about 580° C. to about 630° C. First layer 110 is generally maintained or "held" at a temperature within the desired range for a desired time, which in some embodiments is up to about 60 minutes, and in particular embodiments is up to about 30 minutes. Those skilled in the art will appreciate that the time desired to effect the phase transformation within first layer 110 depends in part on the selected processing temperature, with longer times generally used for lower temperatures.

Heating is often performed in an environment that does not unduly promote oxidation or decomposition of the various materials disposed within stack 100. In some embodiments, heating is performed in an environment having oxygen content below about 1000 parts per million (ppm). In some embodiments, the oxygen content is below about 500 ppm, such as less than 50 ppm. The environment may include significant quantities (such as greater than 90% by volume) of gases that are minimally reactive with stack 100, such as nitrogen, argon, or helium, for example.

Figure 2:
FIG. 2 is a schematic cross-sectional representation of an illustrative configuration in accordance with one embodiment of the present invention.
Figure 2:

The heating step may be performed using any of various treatment configurations. In one configuration, stack 100 is simply heated to the desired temperature, such as in a furnace or oven, or through the use of a heat lamp, laser, or other source of heat. In some embodiments, as in FIG. 2, heating is performed in the presence of a cadmium-containing material 200, such as cadmium sulfides or cadmium oxides, disposed external to stack 100. Material 200 may provide a localized concentration of cadmium vapor to suppress volatilization of cadmium out of first layer 110 (FIG. 1), for example. Material 200 is typically disposed in a spaced-apart relationship with stack 100, at a distance that allows desired levels of cadmium suppression as described above. In certain embodiments, the gap distance between material 200 and stack 100 is in a range from about 0.25 millimeters to about 2.5 millimeters. In some embodiments, material 200 is a quantity of cadmium-containing material disposed on a substrate.

Figure 3:
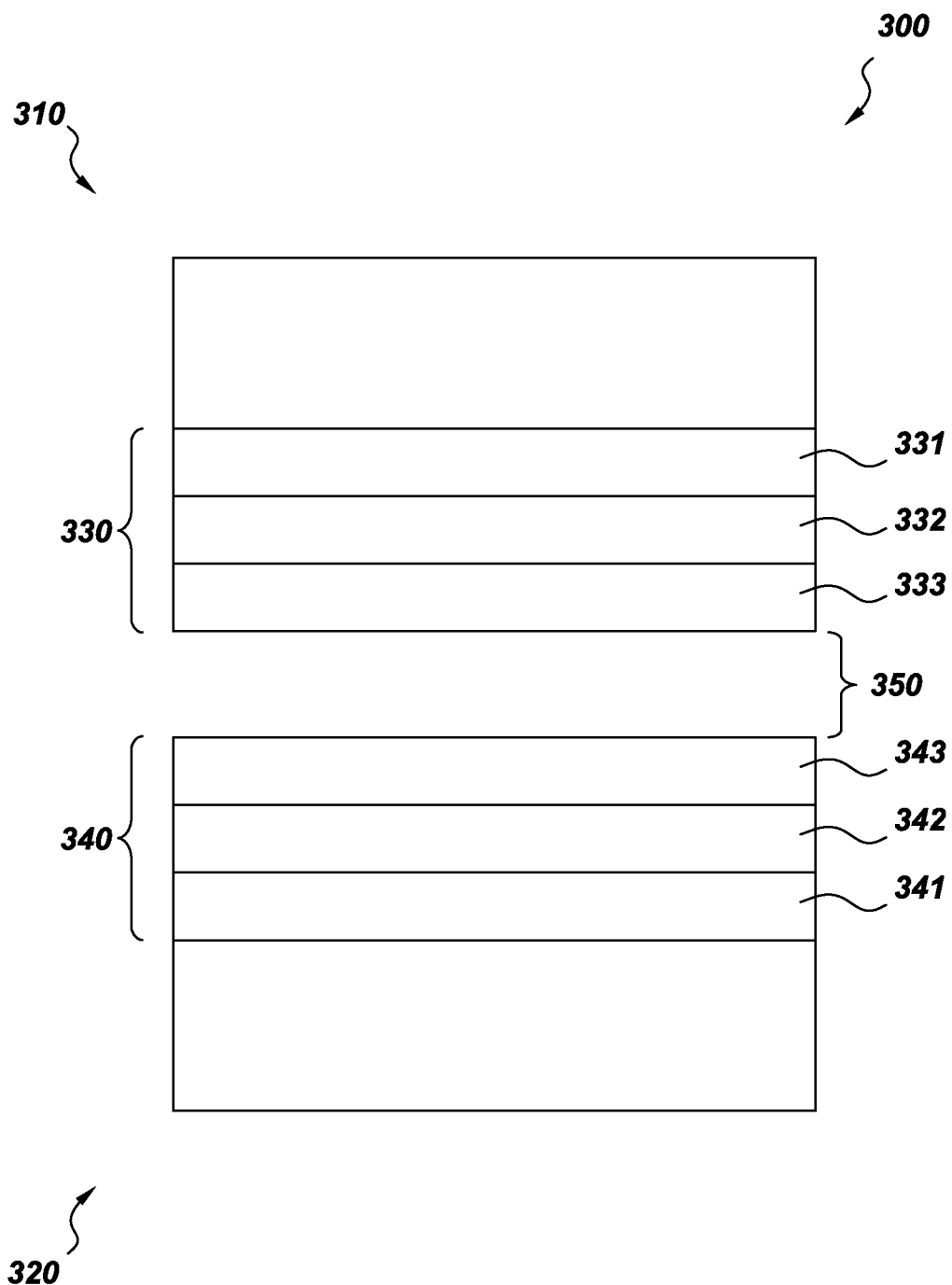
FIG. 3 is a schematic cross-sectional representation of an illustrative configuration in accordance with another embodiment of the present invention.

An alternative configuration for heating is shown in FIG. 3. In this configuration, an assembly 300 comprises two panels 310, 320 disposed in a face-to-face configuration. As used herein, the term "panel" is not intended to limit the embodiment to any particular size or shape. First panel 310 comprises a first layer stack 330 and second panel 320 comprises a second layer stack 340. First layer stack 330 and second layer stack 340 each include a first layer 331, 341 comprising cadmium and tin, a metal layer 332, 342 disposed over the first layer 331, 341, and a window layer 333, 343 disposed over the metal layer 332, 342. Second panel 320 faces first panel 310, meaning the window layers 333, 343 are disposed toward each other either in direct contact with each other or separated by a gap 350. Gap 350 in some embodiments is up to about 6 millimeters.

The heating step, where configuration 300 is employed, comprises heating assembly 300. In effect, window layers 333, 343 serve as the cadmium containing material 200 described previously and illustrated in FIG. 2. Stacks 330 and 340 are instances of stack 100 described previously; all of the various embodiments described for stack 100 apply to stacks 330 and 340. Heating this assembly includes transforming at least a portion of the first layer 331, 341 of either layer stack, or of both layer stacks 330, 340, from an amorphous phase to a crystalline phase.

A stack 100 processed in accordance with any of the embodiments described above may be further processed to fabricate a photovoltaic cell by disposing further materials, such as, for instance, absorber materials (if not already incorporated into stack 100), back contact materials, current collectors, and other cell components as desired, using materials and methods known in the art. Modules, such as solar panels used to produce electrical energy from incident sunlight, may be fabricated by electrically connecting multiple cells, again using methods known in the art.

EXAMPLE

Glass supports (including silicon dioxide and silicon nitride barrier layers) were coated with different film combinations. A first sample had only a CTO film disposed on its surface. A second sample had a stack consisting of a CTO film, a zinc tin oxide (ZTO) film, and a cadmium sulfide film disposed on its surface. A third sample had a stack consisting of a CTO film, a tin layer of up to 30 nm thickness, a ZTO film, and a cadmium sulfide film disposed on its surface. The three samples were heat treated using a face-to-face configuration at 630° C. for a hold time of 15 minutes in a nitrogen atmosphere with a starting pressure of about 100 Torr, and then the sheet resistance of the resulting CTO layer was measured. The third sample showed a remarkable reduction in sheet resistance compared to that measured for the other two samples: about a 75% reduction relative to the first sample and about a 25% reduction relative to the second sample. A lower sheet resistance is generally beneficial to the performance of devices, such as photovoltaic devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method comprising:
heating a layer stack comprising a plurality of layers, the plurality of layers comprising
a) a first layer comprising cadmium and tin,
b) a metal layer capable of forming metal oxides and consisting essentially of metals having a higher affinity for oxygen than cadmium tin oxide, and
c) a window layer disposed over the metal layer;
wherein heating comprises transforming at least a portion of the first layer from an amorphous phase to a crystalline phase; and
wherein the plurality of layers further comprises an electrically resistive buffer layer disposed between the metal layer and the window layer.

2. The method of claim 1, wherein the metal layer is disposed over the first layer.

3. The method of claim 1, wherein the window layer comprises cadmium.

4. The method of claim 3, wherein the window layer comprises cadmium sulfide.

5. The method of claim 1, wherein the buffer layer comprises tin oxide, zinc oxide, zinc tin oxide, zinc stannate, zinc magnesium oxide, gallium oxide, aluminum oxide, or silicon oxide.

6. The method of claim 1, wherein the crystalline phase comprises a spinel.

7. The method of claim 6, wherein the spinel comprises cadmium, tin, and oxygen.

8. The method of claim 1, wherein heating comprises heating the first layer to a temperature in a temperature range from about 500° C. to about 700° C.

9. The method of claim 1, wherein heating comprises holding the first layer at said temperature range for a hold time in the range up to about 60 minutes.

10. The method of claim 1, wherein the metal layer is selected from layers of tin, aluminum, zinc, tantalum, titanium, zirconium, vanadium, indium, nickel, or magnesium.

11. The method of claim 1, wherein the metal layer has a thickness up to about 30 nanometers.

12. The method of claim 1, wherein the metal layer has a thickness in a range from about 1 nanometer to about 20 nanometers.

13. The method of claim 1, wherein the plurality of layers further comprises an absorber layer disposed over the window layer.

14. The method of claim 13, wherein the absorber layer comprises cadmium telluride.

15. The method of claim 1, wherein heating the layer stack comprises heating the layer stack disposed on a support.

16. The method of claim 15, wherein the support comprises a glass.

17. The method of claim 15, wherein the support comprises a metal or a polymer.

18. The method of claim 1, wherein heating comprises heating the stack in the presence of a cadmium-containing material disposed external to the stack.

19. The method of claim 1, wherein heating further comprises heating an assembly, the assembly comprising a first panel comprising a first layer stack disposed on a first support, and a second panel comprising a second layer stack disposed on a second support,
wherein the window layer of the second panel faces the window layer of the first panel.

20. A method comprising:
heating an assembly, the assembly comprising a first panel comprising a first layer stack disposed on a first support, and a second panel comprising a second layer stack disposed on a second support,
wherein each of the first layer stack and the second layer stack comprises
a) a first layer comprising cadmium and tin,
b) a metal layer disposed over the first layer, the metal layer capable of forming metal oxides and consisting essentially of metals having a higher affinity for oxygen than cadmium tin oxide, and
c) a window layer disposed over the metal layer;
wherein the window layer of the second panel faces the window layer of the first panel, and
wherein heating comprises transforming at least a portion of the first layer of either layer stack, or of both layer stacks, from an amorphous phase to a crystalline phase.

21. The method of claim 20, wherein the window layers comprise cadmium, such that the window layer of the second layer stack provides a cadmium-containing material disposed external to the first stack and the window layer of the first layer stack provides a cadmium-containing material disposed external to the second stack.

22. A method comprising:
heating a layer stack comprising a plurality of layers, the plurality of layers comprising
a) a first layer comprising cadmium and tin,
b) a metal layer, the metal layer capable of forming metal oxides and consisting essentially of metals having a higher affinity for oxygen than cadmium tin oxide, and
c) a window layer disposed over the metal layer;
wherein heating comprises transforming at least a portion of the first layer from an amorphous phase to a crystalline phase; and wherein heating further comprises heating the stack in the presence of a cadmium-containing material disposed external to the stack, the cadmium-containing material comprising cadmium sulfide or cadmium oxide.

* * * * *